United States Patent
Kang et al.

(10) Patent No.: US 8,883,608 B2
(45) Date of Patent: Nov. 11, 2014

(54) METHODS OF MANUFACTURING A SEMICONDUCTOR DEVICE

(71) Applicant: Samsung Electronics Co., Ltd., Suwon-si (KR)

(72) Inventors: Jong-Hoon Kang, Suwon-si (KR); Tae-Gon Kim, Seoul (KR); Han-Mei Choi, Seoul (KR); Eun-Young Jo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/894,736

(22) Filed: May 15, 2013

(65) Prior Publication Data

US 2014/0065793 A1 Mar. 6, 2014

(30) Foreign Application Priority Data

Aug. 30, 2012 (KR) .................. 10-2012-0095495

(51) Int. Cl.
*H01L 21/76* (2006.01)
*H01L 27/108* (2006.01)
*H01L 21/3213* (2006.01)
*H01L 23/544* (2006.01)
*H01L 49/02* (2006.01)
*H01L 21/027* (2006.01)

(52) U.S. Cl.
CPC ..... *H01L 21/027* (2013.01); *H01L 2223/54453* (2013.01); *H01L 2223/54426* (2013.01); *H01L 27/10894* (2013.01); *H01L 2223/5442* (2013.01); *H01L 21/32139* (2013.01); *H01L 23/544* (2013.01); *H01L 27/10852* (2013.01); *H01L 28/91* (2013.01)
USPC ............................................. 438/401; 438/96

(58) Field of Classification Search
None
See application file for complete search history.

(56) References Cited

U.S. PATENT DOCUMENTS

| | | |
|---|---|---|
| 5,283,205 A | 2/1994 | Sakamoto |
| 2004/0014296 A1 | 1/2004 | Kwak et al. |
| 2011/0034014 A1 | 2/2011 | Hatem et al. |

FOREIGN PATENT DOCUMENTS

| | | |
|---|---|---|
| JP | 6-302512 A | 10/1994 |
| JP | 2006-203047 A | 8/2006 |
| JP | 2010-109190 A | 5/2010 |
| KR | 2002-0037419 A | 5/2002 |
| KR | 10-2007-0070383 A | 7/2007 |
| KR | 10-2010-0120038 A | 11/2010 |

*Primary Examiner* — Yasser A Abdelaziez
(74) *Attorney, Agent, or Firm* — Myers Bigel Sibley & Sajovec, P.A.

(57) ABSTRACT

An alignment mark is formed on a substrate including a first region and a second region. The alignment mark is formed in the second region. An etch target layer including a crystalline material is formed on the alignment mark and the substrate. The etch target layer in the first region is partially amorphized. The amorphized etch target layer is etched to form an opening.

17 Claims, 12 Drawing Sheets

US 8,883,608 B2

METHODS OF MANUFACTURING A SEMICONDUCTOR DEVICE

CROSS-REFERENCE TO RELATED APPLICATION

This application claims priority under 35 USC §119 to Korean Patent Application No. 10-2012-0095495 filed on Aug. 30, 2012 in the Korean Intellectual Property Office (KIPO), the entire disclosure of which is incorporated herein by reference.

BACKGROUND

1. Field

Example embodiments relate to methods of manufacturing semiconductor devices.

2. Description of the Related Art

As the integration degree of a semiconductor device increases, the formation of patterns having minute line widths is desirable. In addition, as the line width decreases, it may become more difficult to reduce mis-alignment.

When an opening is formed by etching a layer including crystalline silicon, the sidewall of the opening may be formed along a grain boundary to adversely increase the roughness of the sidewall. When the opening is formed by etching a layer including amorphous silicon, the transmittance of the etch target layer may be low, which can deteriorate an alignment.

SUMMARY

Example embodiments can provide methods of forming an opening having a desired sidewall profile.

Example embodiments can provide methods of manufacturing a semiconductor device using the methods of forming an opening having a desired sidewall profile.

According to example embodiments, there is provided a method of forming an opening. In the method, a first alignment mark is on a substrate including a first region and a second region. The first alignment mark is formed in the second region. An etch target layer including a crystalline material is formed on the first alignment mark and the substrate. The etch target layer in the first region is partially amorphized. The amorphized etch target layer is etched.

In example embodiments, amorphizing the etch target layer in the first region may include an ion implantation process.

In example embodiments, the ion implantation process may use silicon (Si), boron (B), phosphor (P), arsenic (As), germanium (Ge) or indium (In) ions.

In example embodiments, the ion implantation process may be conducted by injection energy of about 50 KeV to about 3,000 KeV, with a dose of about 1E15 ions/cm² to about 1E16 ions/cm².

In example embodiments, the ion implantation process may be conducted twice or more times by changing the injection energy and a kind of the ions.

In example embodiments, after amorphizing the etch target layer positioned in the first region, a photoresist layer may be formed on the etch target layer. The substrate may be aligned with a photo mask by using the first alignment mark. The photoresist layer may be partially removed to form a photoresist pattern through a photolithography process using the photo mask.

In example embodiments, before forming the photoresist layer, a mask layer may be formed on the etch target layer. After forming the photoresist layer, the mask layer may be partially removed to form a mask through an etching process using the photoresist pattern. The mask may be used as an etching mask while etching the amorphized etch target layer.

In example embodiments, the photo mask may include a second alignment mark, and the second alignment mark may have a position and a shape corresponding to the first alignment mark.

In example embodiments, forming the etch target layer may include depositing a polysilicon layer or an impurity doped polysilicon layer on the substrate.

In example embodiments, forming the etch target layer may include forming an amorphous silicon layer or an impurity doped amorphous silicon layer on the substrate, and crystallizing the amorphous silicon layer or the impurity doped amorphous silicon layer.

In example embodiments, the first alignment mark may be formed on an upper portion of the substrate.

In example embodiments, the first alignment mark may be formed on the substrate.

According to example embodiments, there is provided a method of manufacturing a semiconductor device. In the method, a transistor including a gate structure and an impurity region is formed on a substrate including a first region and a second region. The transistor is formed in the first region. A first alignment mark is formed on the substrate in the second region. An insulating interlayer is formed on the substrate to cover the transistor and the first alignment mark. The insulation interlayer receives a plug contacting the impurity region. A sacrificial layer including a crystalline material is formed on the plug and the insulating interlayer. The sacrificial layer disposed in the first region is partially amorphized. The sacrificial layer is etched to form an opening exposing the plug. A lower electrode is formed on an inner wall of the opening and the exposed plug. The sacrificial layer is removed. A dielectric layer and an upper electrode are sequentially formed on the lower electrode.

In example embodiments, amorphizing the sacrificial layer disposed in the first region may include implanting silicon (Si), boron (B), arsenic (As), germanium (Ge), or indium (In) ions with injection energy of about 50 KeV to about 3,000 KeV, with a dose of about 1E15 ions/cm² to about 1E16 ions/cm².

In example embodiments, after amorphizing the sacrificial layer, a photoresist layer may be formed on the sacrificial layer. The substrate may be aligned with a photo mask by using the first alignment mark. The photoresist layer may be partially removed to form a photoresist pattern through a photolithography process using a photo mask.

According to other example embodiments, a method of manufacturing a semiconductor device comprises forming a material layer on a substrate having an alignment mark, the material layer comprising an amorphous portion that is laterally offset from the alignment mark and a crystalline portion that is over the alignment mark. The amorphous portion is then photolithographically etched, using the alignment mark that is under the crystalline portion. In some embodiments, the material layer comprises elemental silicon.

In some embodiments, the photolithographically etching the amorphous portion comprises forming a photoresist layer on the material layer, aligning the substrate with a photo mask using the alignment mark, patterning the photoresist layer using the photo mask that is aligned with the substrate, and etching the amorphous portion using the photoresist layer that is patterned. Moreover, in some embodiments, the forming a material layer on the substrate comprises forming a crystalline layer on the substrate, and selectively amorphizing the crystalline layer to form the amorphous portion of the material layer that is laterally offset from the alignment mark. In contrast, in other embodiments, the forming a material layer on the substrate comprises forming an amorphous layer on the substrate, and selectively crystallizing the amorphous layer to form the crystalline portion of the material layer that is over the alignment mark.

According to example embodiments, an etch target layer may include an amorphous portion positioned in a first region and a crystalline portion positioned in a second region, and the amorphous portion is amorphized by an ion implantation process. Since the crystalline portion may have a relatively high transparency, the position of a first alignment mark in the second region may be easily detected, and the degree of alignment precision in a photolithography process may be improved. In addition, an opening may be formed by etching the amorphous portion. In this case, the opening may have a decreased sidewall roughness.

BRIEF DESCRIPTION OF THE DRAWINGS

Example embodiments will be more clearly understood from the following detailed description taken in conjunction with the accompanying drawings.

FIG. 1 is a plan view illustrating a method of forming an opening in accordance with example embodiments;

FIGS. 2 to 10 are cross-sectional views illustrating a method of forming the opening in FIG. 1;

FIGS. 11 and 12 are cross-sectional views illustrating a method of forming an opening in accordance with other example embodiments;

FIGS. 13 and 14 are cross-sectional views illustrating a method of forming an opening in accordance with further other example embodiments; and FIGS. 15 to 22 are cross-sectional views illustrating a method of manufacturing a semiconductor device in accordance with example embodiments.

DETAILED DESCRIPTION OF THE EMBODIMENTS

Figure 1:
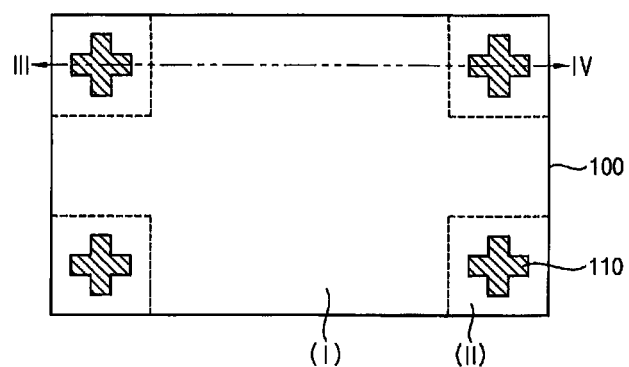
FIGS. 1 to 22 represent non-limiting, example embodiments as described herein.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings.

FIG. 1 is a plan view illustrating a method of forming an opening in accordance with example embodiments, and FIGS. 2 to 10 are cross-sectional views illustrating a method of forming the opening in FIG. 1. Particularly, FIGS. 2 to 10 are cross-sectional views taken along a line III-IV in FIG. 1.

Figure 2:
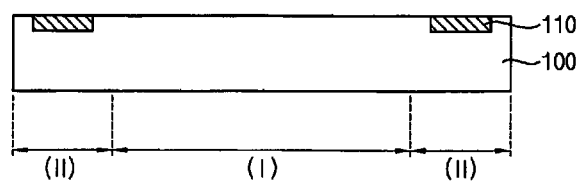

Referring to FIGS. 1 and 2, a first alignment mark 110 may be formed on a substrate 100.

The substrate 100 may include a semiconductor substrate. Particularly, the substrate 100 may include a silicon substrate, a germanium substrate, a silicon-germanium substrate, a silicon-on-insulator (SOI) substrate, a germanium-on-insulator (GOI) substrate, etc.

The substrate 100 may include a first region (I) and a second region (II). Particularly, the first region (I) may be a region for disposing semiconductor devices, and the second region (II) may be a region for aligning photo masks. In example embodiments, a plurality of second regions (II) may be disposed in the peripheral region of the substrate 100.

The first alignment mark 110 may be formed by forming a first recess (not illustrated) by partially etching the upper portion of the substrate 100 in the second region (II), forming an insulating layer on the substrate 100 to fill the first recess, and planarizing the insulating layer until exposing an upper surface of the substrate 100. Therefore, an upper surface of the first alignment mark may have a height substantially the same as that of the substrate 100. In example embodiments, a plurality of first alignment marks 110 may be formed on the substrate 100.

In example embodiments, the insulating layer may be formed by using silicon nitride or silicon oxide. The planarizing process may be conducted by a chemical mechanical polishing (CMP) process and/or an etch-back process.

Since the first alignment marks 110 may have different refractive index and/or reflectivity from those of the substrate 100, the positions of the first alignment marks 110 may be easily detected. The first alignment marks 110 may be used for aligning the position of the substrate 100 and a photo mask 160 (see FIG. 7) in a following patterning process.

Figure 3:
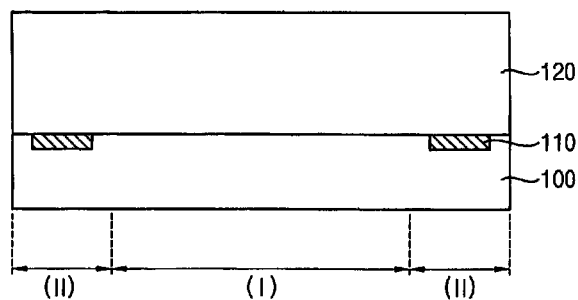

Referring to FIG. 3, an etch target layer 120 including a crystalline material may be formed on the substrate 100 and the first alignment marks 110.

In example embodiments, the etch target layer 120 may be formed using polysilicon or impurity doped polysilicon on the substrate 100 by a CVD process, a PECVD process, an LPCVD process, etc.

In other example embodiments, the etch target layer 120 may be formed using an amorphous silicon or an impurity doped amorphous silicon by a CVD process, a PECVD process or a LPCVD process, and then, crystallizing the amorphous silicon or the impurity doped amorphous silicon. The crystallization may be conducted by a solid phase crystallization (SPC) process or an excimer laser annealing (ELA) process.

Figure 4:
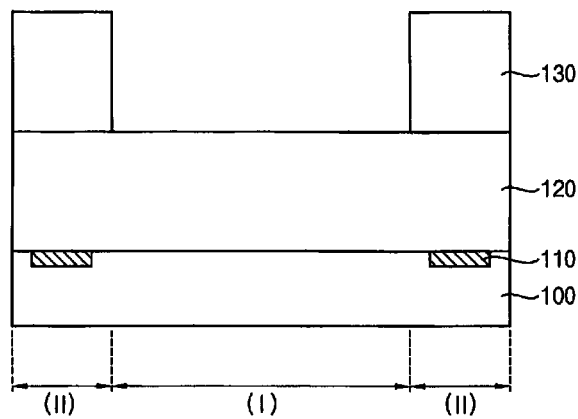

Referring to FIG. 4, a first mask 130 may be formed on the etch target layer 120.

In example embodiments, the first mask 130 may be formed by forming a first mask layer using a nitride such as silicon nitride on the etch target layer 120, and patterning the first mask layer through a photolithography process. The first mask 130 may be positioned in the second region (II), so that the whole etch target layer 120 positioned in the first region (I) may be exposed by the first mask 130.

Figure 5:
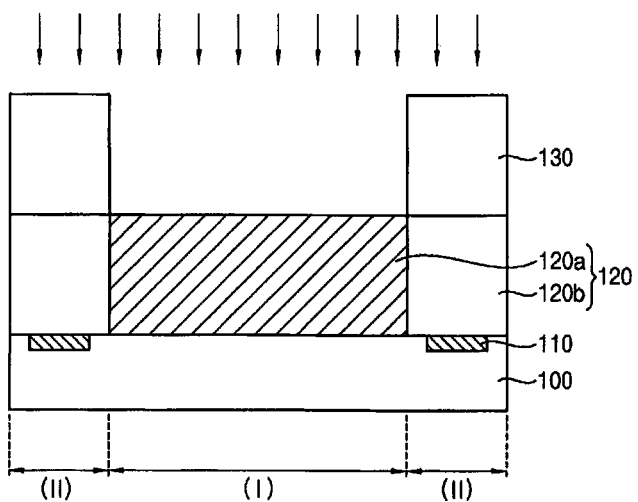

Referring to FIG. 5, the etch target layer 120 may be partially amorphized.

The amorphization may be conducted through an ion implantation process using the first mask layer 130 as an ion implantation mask. A portion of the etch target layer 120 disposed in the first region (I) may be amorphized, while a portion of the etch target layer 120 disposed in the second region (II) may not be amorphized. In example embodiments, the ion implantation process may be conducted by a beamline ion implantation process, a plasma doping process or a cluster doping process using silicon (Si), boron (B), phosphor (P), arsenic (As), germanium (Ge) or indium (In) ions.

While conducting the ion implantation process, the ions may be doped with a relatively high dose by applying ion implantation energy to sufficiently amorphize the etch target layer 120. In example embodiments, the ion implantation process may be conducted by injecting energy of about 50 KeV to about 3,000 KeV, with a dose of about $1E15$ ions/cm$^2$ to about $1E16$ ions/cm$^2$. In another example embodiment, the ion implantation process may include a multi ion implantation process by which the ion implantation process may be repeatedly conducted two times or more times while changing the kinds of the doping ions, the injecting energy and the dose. The doped ions in the ion implantation process may have straightness, and the ion implantation depth may be controlled depending on the injection energy. Thus, the etch target layer 120 may be wholly or partially amorphized to a desired thickness.

Accordingly, the etch target layer 120 may include an amorphous portion 120a disposed in the first region (I) and a crystalline portion 120b disposed in the second region (II). The amorphous portion 120a may include an amorphous material such as amorphous silicon, while and the crystalline portion 120b may include a crystalline material such as polysilicon.

Figure 6:
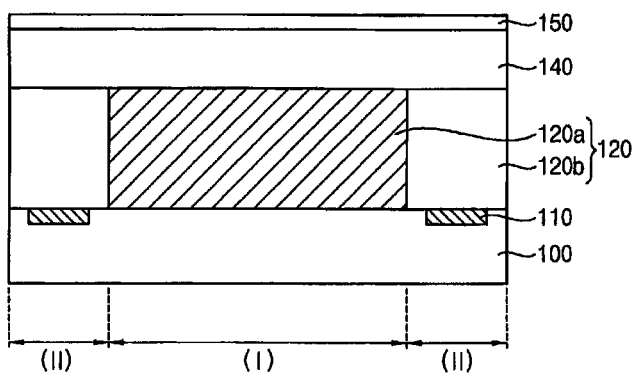

Referring to FIG. 6, after removing the first mask 130, a second mask layer 140 and a photoresist layer 150 may be formed sequentially on the etch target layer 120.

The second mask layer 140 may be formed using a nitride such as silicon nitride by a CVD process, a PECVD process, an ALD process, etc. In addition, the photoresist layer 150 may be formed on the second mask layer 140 using a photoresist material of which chemical properties may be changed after exposing, by a spin coating process, a spray process, etc.

Figure 7:
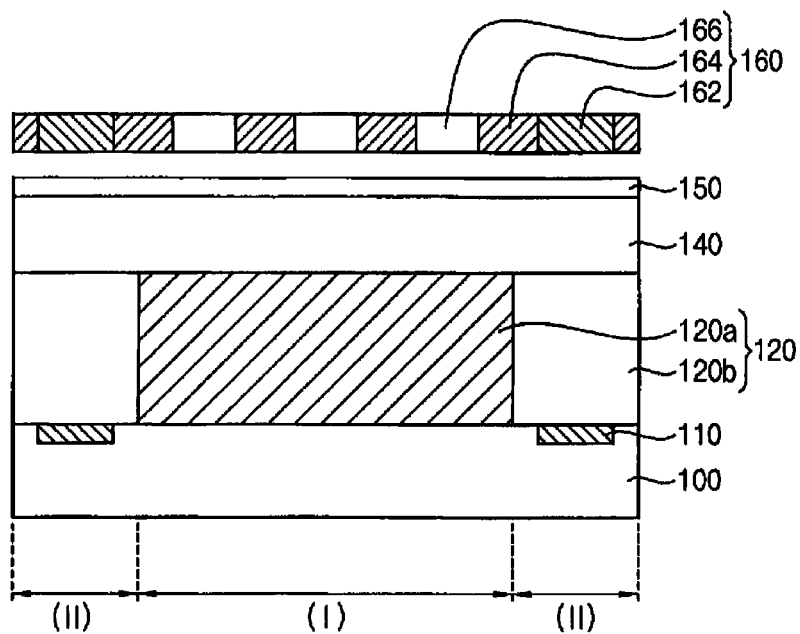

Referring to FIG. 7, after detecting the positions of the first alignment marks 110 disposed on the substrate 100, a photo mask 160 may be aligned so as to face the substrate 100.

In this case, the position of the first alignment marks 110 may be detected through an optical method. In example embodiments, the position of the first alignment marks 110 may be detected by exposing the substrate 100 to a light, and measuring a reflected light from the first alignment marks 110. Since the first alignment marks 110 may include a material having different refractive index and/or reflectivity from those of the substrate 100, the light reflected from the first alignment marks 110 may have a different brightness from the reflected light from the substrate 100. Thus, the position of the first alignment marks 110 may be detected.

In example embodiments, the first alignment marks 110 may be covered with the crystalline portion 120b including the crystalline material such as polysilicon, and the crystalline material may have a higher transparency than that of the amorphous material. Thus, the position of the first alignment marks 110 may be easily detected.

Meantime, the photo mask 160 may include second alignment marks 162, a light shielding portion 164 and a transparent portion 166. Each of the second alignment marks 162 may have a position and a shape corresponding to those of the first alignment marks 110. The second alignment marks 162 may be arranged to overlap the first alignment marks 110, and the photo mask 160 may be arranged to face the substrate 100.

Figure 8:
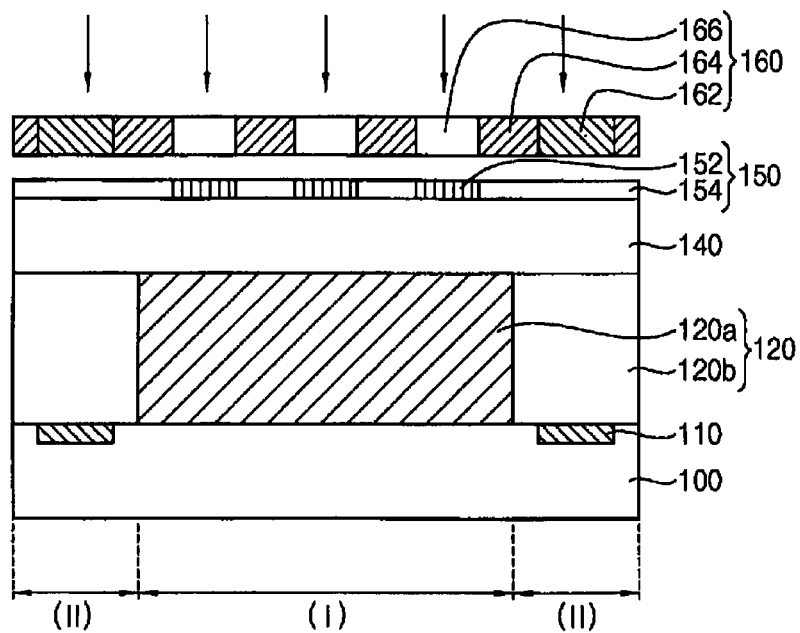

Referring to FIG. 8, the photoresist layer 150 may be partially exposed by using the photo mask 160.

In the exposing process, a light source may be used to expose, for example, an I-line of a mercury lamp (365 nm), a KrF excimer laser (248 nm), an ArF excimer laser (193 nm), an F2 excimer laser (157 nm), or an extreme ultraviolet (EUV).

The light emitted from the light source may be blocked by the light shielding portion 164, but may pass through the transparent portion 166 to reach the photoresist layer 150. Accordingly, the photoresist layer 150 exposed by the transparent portion 166 may be exposed, so that the photoresist layer 150 may be divided into an exposed portion 152 and an unexposed portion 154.

The exposed portion 152 and the unexposed portion 154 may have respective etching selectivity, and may be selectively removed through a wet etching process. In example embodiments, the exposed portion 152 may be removed from the photoresist layer 150 to form a photoresist pattern. In another example embodiment, even though not illustrated, the unexposed portion 154 may be removed from the photoresist layer 150 to form the photoresist pattern.

Figure 9:
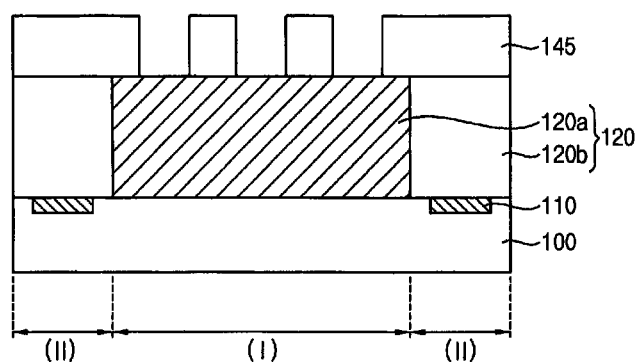

Referring to FIG. 9, the second mask layer 140 may be partially removed to form a second mask 145.

The second mask 145 may be formed by partially removing the second mask layer 140 through conducting an etching process using the photoresist pattern as an etching mask. Accordingly, the second mask 145 may partially expose the amorphous portion 120a of the etch target layer 120.

Then, an ashing process may be additionally conducted to remove the remaining photoresist pattern.

Figure 10:
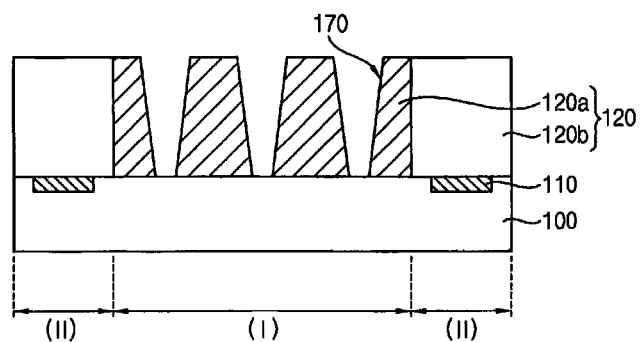

Referring to FIG. 10, the amorphous portion 120a of the etch target layer 120 may be partially removed to form openings 170 exposing a portion of the first region (I) of the substrate 100.

The openings 170 may be formed by a dry etching process using the second mask 145 as an etching mask. In example embodiments, the etching process may be conducted by using an etching gas including HF, HBr, $CF_4$, $C_2F_6$, $CHF_3$, $CH_2F_2$, $CH_3Br$, $CClF_3$, $CBrF_3$, $CCl_4$, $SF_6$, $Cl_2$, HBr, $NF_3$, etc.

If the opening is formed by partially removing the thin film 120 including the crystalline material such as polysilicon, the sidewall of the opening may be formed along a grain boundary. Thus, the roughness of the sidewall may be increased. However, in example embodiments, the openings 170 may be formed by partially removing the amorphous region 120a including the amorphous material such as amorphous silicon, the sidewall of the openings 170 may have a good profile when comparing with the sidewall of the openings formed by removing polysilicon.

In example embodiments, the etch target layer 120 including the crystalline material may be partially amorphized through an ion implantation process. Accordingly, the etch target layer 120 may include the amorphous portion 120a disposed in the first region (I) and the crystalline portion 120b disposed in the second region (II). Since the crystalline portion 120b has a relatively high transparency, the position of the first alignment mark 110 in the second region (II) may be easily detected, and alignment precision during conducting a photolithography process may be improved. In addition, the opening 170 may be formed by partially removing the amorphous portion 120a. Thus, the roughness of the sidewall of the opening 170 may be decreased.

Figure 11:
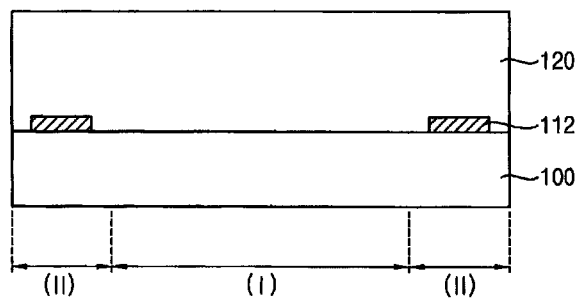
Figure 12:
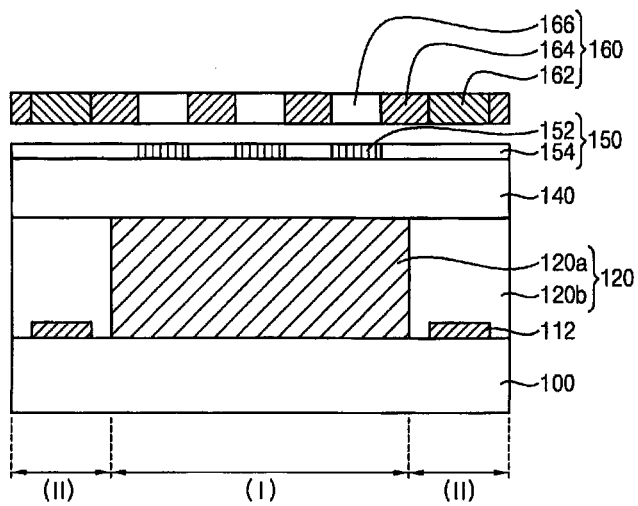

FIGS. 11 and 12 are cross-sectional views illustrating a method of forming an opening in accordance with other example embodiments.

The method of forming the pattern may include processes substantially the same as or similar to the processes included in the method of forming the pattern described with reference to FIGS. 1 to 10. Therefore, the same reference numeral will be designated to the same elements, and explanation on the repeated elements will be omitted.

Referring to FIG. 11, first alignment marks 112 may be formed on a substrate 100, and an etch target layer 120 may be formed on the substrate 100 and the first alignment marks 112.

The first alignment marks 112 may be formed by forming an insulating layer on the substrate 100 and then patterning the insulating layer. Particularly, the insulating layer may be formed by using silicon nitride or silicon oxide. Since the first alignment marks 112 may be formed on the substrate 100, a step may be formed between the upper surfaces of the first alignment marks 112 and the upper surface of the substrate 100.

An etch target layer 120 may be formed on the substrate 100 to cover the first alignment marks 112 through conducting substantially the same or similar processes explained referring to FIG. 3.

Then, substantially the same or similar processes as the processes described with reference to FIGS. 4 to 7 may be conducted.

Referring to FIG. 12, the position of the first alignment marks 112 may be detected to arrange a photo mask 160 so as to face the substrate 100.

In example embodiments, the positions of the first alignment marks 112 may be detected by exposing the substrate 100 to a light, and measuring a reflected light. Since the first alignment marks 112 may include a material having different refractive index and/or reflectivity from those of the substrate 100, the reflected light from the first alignment marks 112 may have different brightness from the reflected light from the substrate 100. Thus, the position of the first alignment marks 112 may be detected. In addition, as the step presents between the upper surface of the first alignment marks 112 and the upper surface of the substrate 100, the light may be scattered at the stepped portion. By using the scattering phenomenon, the positions of the first alignment marks 112 may be more accurately detected.

In example embodiments, the first alignment marks 112 may be covered by a crystalline portion 120b including a crystalline material, and the crystalline material may have a higher transparency than that of the amorphous material. Thus, the positions of the first alignment marks 112 may be easily detected.

Then, substantially the same or similar processes as the processes explained referring to FIGS. 8 to 10 may be conducted for patterning the etch target layer 120.

In example embodiments, the etch target layer 120 may include an amorphous portion 120a disposed in the first region (I) and a crystalline portion 120b disposed in the second region (II), and the amorphous portion 120a may be amorphized through an ion implantation process. The crystalline portion 120b may have a relatively high transparency, and a step may be formed between the first alignment marks 112 and the substrate 100. Thus, the positions of the first alignment marks 112 may be easily detected and so, a misalignment may be prevented. In addition, since the opening may be formed by partially removing the amorphous portion 120a, the roughness of the sidewall of the opening may be decreased.

Figure 13:
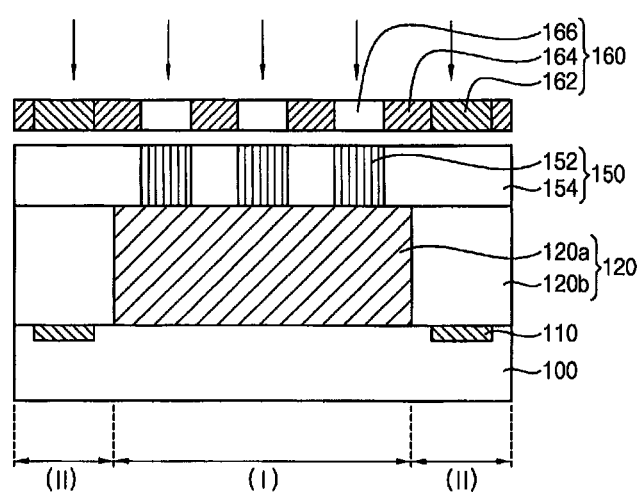
Figure 14:
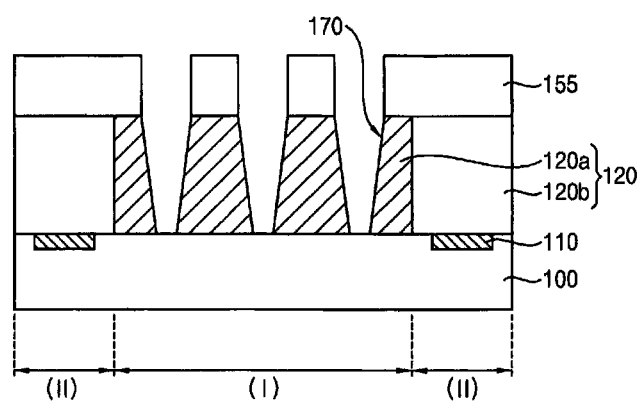

FIGS. 13 and 14 are cross-sectional views illustrating a method of forming an opening in accordance with further other example embodiments.

The method of forming the pattern may include processes substantially the same as or similar to the processes included in the method of forming the pattern explained referring to FIGS. 1 to 10. Therefore, the same reference numerals will be designated to the same elements, and explanation on the elements will be omitted.

First, substantially the same or similar processes explained referring to FIGS. 1 to 7 may be conducted. However, a second mask layer disposed between the etch target layer 120 and the photoresist layer 150 may be omitted.

Referring to FIG. 13, the photoresist layer 150 may be partially exposed by conducting substantially the same or similar processes explained referring to FIG. 8. Then, the photoresist layer 150 may be divided into an exposed portion 152 and an unexposed portion 154.

Referring to FIG. 14, the exposed portion 152 may be removed to form a photoresist pattern 155, and the amorphous portion 120a of the thin film 120 may be partially removed to form openings 170 using the photoresist pattern 155.

Since the exposed portion 152 and the unexposed portion 154 may have an etching selectivity, the exposed portion 152 may be easily removed through a wet etching process. Through removing the exposed portion 152 from the photoresist layer 150, the photoresist pattern 155 may be formed.

Meantime, the openings 170 may be formed through a dry etching process using the photoresist pattern 155 as an etching mask.

In example embodiments, the thin film 120 may include the amorphous portion 120a disposed in the first region (I) and a crystalline portion 120b disposed in the second region (II). In addition, since the photoresist pattern 155 may be used as an etching mask during forming the opening 170, a forming process of an additional mask may be omitted.

FIGS. 15 to 22 are cross-sectional views illustrating a method of manufacturing a semiconductor device in accordance with example embodiments.

Figure 15:
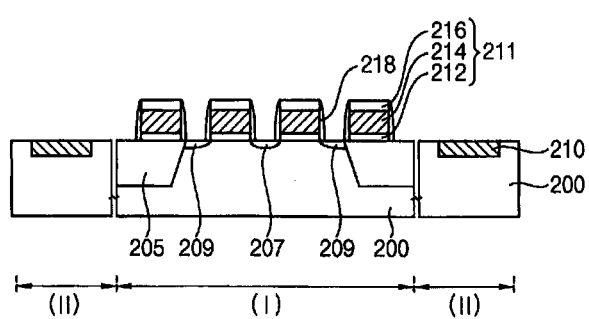

Referring to FIG. 15, a device isolation layer 205, a gate structure 211 and impurity regions 207 and 209 may be formed on the substrate 200 in a first region (I), and first alignment marks 210 may be formed in a second region (II) of the substrate 200.

The substrate 200 may include a semiconductor substrate, and may be divided into the first region (I) and the second region (II).

The device isolation layer 205 may be formed on the substrate 200. In example embodiments, the device isolation layer 205 may be formed through a shallow trench isolation (STI) process.

The gate structures 211 may be formed by forming a gate insulating layer, a gate electrode layer and a hard mask layer sequentially on the substrate 200, and patterning through a photolithography process to form a gate insulating layer pattern 212, a gate electrode 214 and a hard mask 216, respectively. The gate insulating layer may be formed using silicon oxide or a metal oxide. The gate electrode layer may be formed using doped polysilicon or a metal. The hard mask layer may be formed using silicon nitride.

Then, first and second impurity regions 207 and 209 may be formed on an upper portion of the substrate 200 near the gate structures 211 through an ion implantation process using the gate structures 211 as an ion implantation mask.

The gate structure 211 and the impurity regions 207 and 209 may form a transistor, and the first and second impurity regions 207 and 209 may function as the source/drain regions of the transistor. On the sidewall of the gate structure 211, spacers 218 may be formed using silicon nitride.

The first alignment marks 210 may be formed on the upper portion of the substrate 200 in the second region (II). Processes for forming the first alignment marks 210 may be substantially the same or similar to the processes explained referring to FIG. 2, and so, detailed explanation on the processes will be omitted.

Figure 16:
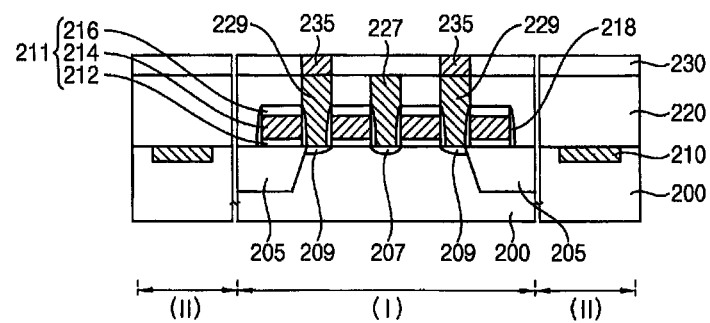

Referring to FIG. 16, a first insulating interlayer 220 and a second insulating interlayer 230 may be formed on the substrate 200 to cover the gate structures 211 and the first alignment marks 210 sequentially, and a first plug 227, a second plug 229 and a third plug 235 penetrating a portion of the first and second insulating interlayers 220 and 230 may be formed.

The first insulating interlayer 220 may be formed on the substrate 200 to cover the gate structures 211, the spacers 218 and the first alignment marks 210.

The first and second plugs 227 and 229 may be formed by partially etching the first insulating interlayer 220 to form first holes (not illustrated) exposing the impurity regions 207 and 209, forming a first conductive layer filling the first holes on the exposed impurity regions 207 and 209 and the first insulating interlayer 220, and removing the upper portion of the first conductive layer until exposing the first insulating interlayer 220 by means of a CMP process and/or an etch back process. In example embodiments, the first holes may be self-aligned by the gate structures 211 and the spacers 218. The first conductive layer may be formed using polysilicon, a metal, etc.

The first plug 227 may make a contact with the first impurity region 207, the second plug 229 may make a contact with the second impurity region 209, and the first plug 227 may function as a bit line contact.

A bit line (not illustrated) may be formed by forming and patterning a second conductive layer (not illustrated) making a contact with the first plug 227 on the first insulating interlayer 220. The second conductive layer may be formed by using polysilicon, a metal, etc. Then, a second insulating interlayer 230 covering the bit line may be formed on the first insulating interlayer 220.

A third plug 235 may be formed by partially etching the second insulating interlayer 230 to form second holes (not illustrated) exposing the second plug 229, forming a third conductive layer filling the second holes on the exposed second plug 229 and the second insulating interlayer 230, and removing the upper portion of the third conductive layer until exposing the second insulating interlayer 230 by means of a CMP process and/or an etch back process. The third conductive layer may be formed by using polysilicon, a metal, etc.

Both of the second and third plugs 229 and 235 may function as a capacitor contact. Alternatively, the second plug 229 may not be separately formed. The third plug may be formed so as to pass through the first and second insulating interlayers 220 and 230 so as to make a direct contact with the second impurity region 209. The third plug alone may function as the capacitor contact.

Figure 17:
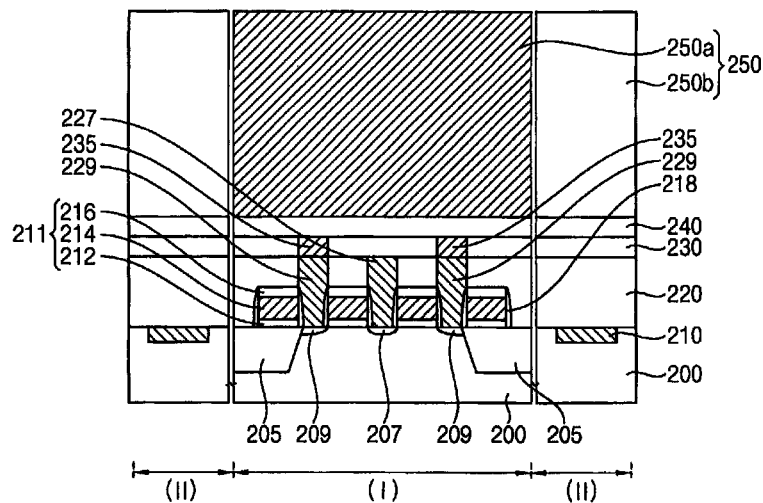

Referring to FIG. 17, an etch stop layer 240 and a sacrificial layer 250 may be formed sequentially on the second insulating interlayer 230 and the third plug 235. Then, the sacrificial layer 250 may be partially amorphized.

The etch stop layer 240 may be formed on the second insulating interlayer 230 and the third plug 235 by means of a CVD process, a PVD process, an ALD process, etc. The etch stop layer 240 may be used as an etching end point while forming an opening 290 (see FIG. 20) in a following process. Alternatively, the etch stop layer 240 may not be formed according to circumstances.

The sacrificial layer 250 may be formed on the etch stop layer 240 using polysilicon, impurity doped polysilicon, germanium, impurity doped germanium, etc. by means of a CVD process, a PECVD process or an LPCVD process, or by forming an amorphous silicon layer or an impurity doped amorphous silicon layer through the CVD process, the PECVD process or the LPCVD process and then, crystallizing the amorphous layer. The sacrificial layer 250 may be substantially the same or similar to the etch target layer 120 explained referring to FIG. 3.

Then, a first mask (not illustrated) may be formed on the sacrificial layer 250. The sacrificial layer 250 positioned in the first region (I) may be amorphized through an ion implantation process using the first mask as an ion implantation mask. In example embodiments, the ion implantation process may be conducted by using silicon (Si), boron (B), phosphor (P), arsenic (As), germanium (Ge), or indium (In) ions by means of a beamline ion implantation process, a plasma doping process, or a cluster doping process. Particularly, the ion implantation process may be conducted by using injection energy of about 50 KeV to about 3,000 KeV with a dose of about 1E15 ions/cm$^2$ to about 1E16 ions/cm$^2$.

The sacrificial layer 250 may include an amorphous portion 250a disposed in the first region (I) and a crystalline portion 250b disposed in the second region (II) and including polysilicon.

Figure 18:
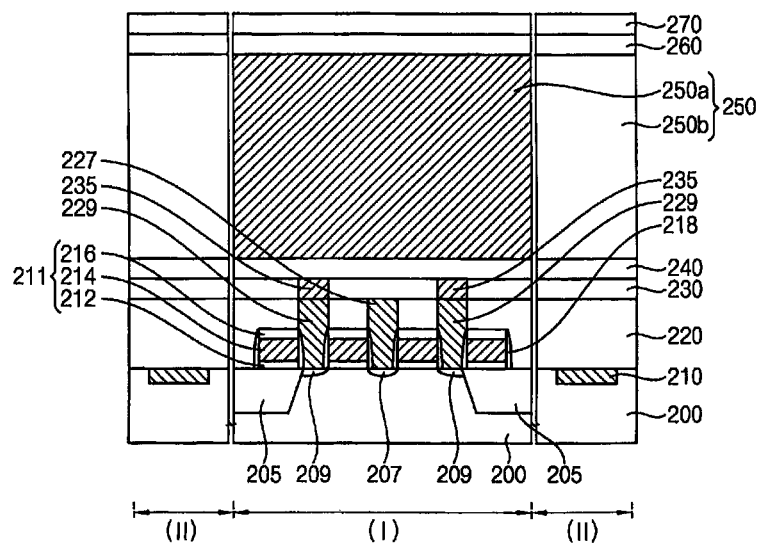

Referring to FIG. 18, a second mask layer 260 and a photoresist layer 270 may be formed one by one on the sacrificial layer 250.

The second mask layer 260 may be formed by using a nitride such as silicon nitride by means of a CVD process, a PECVD process, an ALD process, etc., and the photoresist layer 270 may be formed on the second mask layer 260 by using a photoresist material by means of a spin coating process, a spray process, etc.

Figure 19:
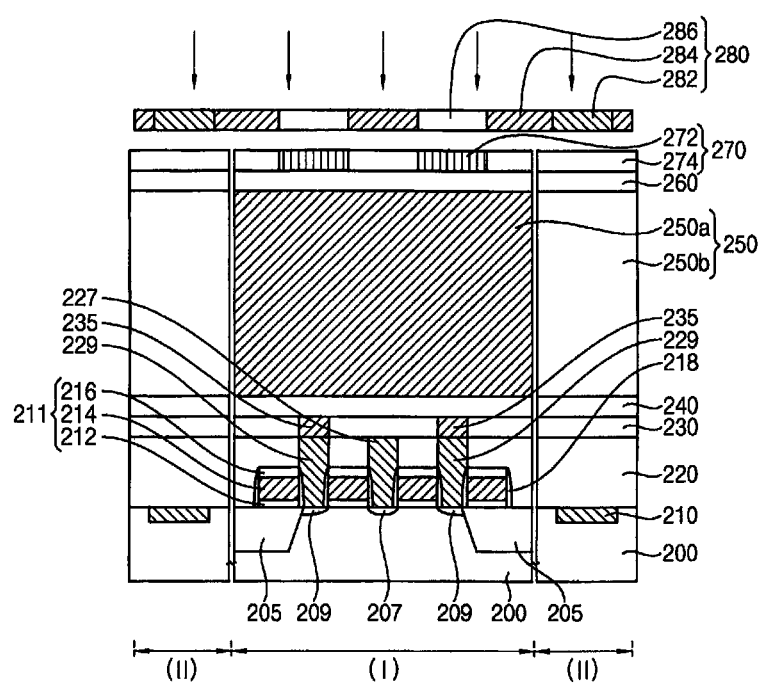

Referring to FIG. 19, the position of the first alignment marks 210 may be detected, a photo mask 280 may be aligned so as to face the substrate 200, and the photoresist layer 270 may be partially exposed.

In example embodiments, the position of the first alignment marks 210 may be detected by exposing the substrate 200 to a light and then detecting a reflected light. The first alignment marks 210 may be covered by the crystalline portion 250b including a crystalline material such as polysilicon, and the crystalline material may have a higher transparency than the amorphous material. Thus, the position of the first alignment marks 210 may be easily detected.

Meantime, the photo mask 280 may include second alignment marks 282, a light shielding portion 284 and a transparent portion 286. The second alignment marks 282 may have a position and a shape corresponding to the first alignment marks 210. In example embodiments, the second alignment marks 282 may be aligned to overlap the first alignment marks 210 to each other. Accordingly, the photo mask 280 may be aligned to face the substrate 200.

Then, the photoresist layer 270 may be partially exposed by using the photo mask 280. While conducting the exposing process, the light emitted from a light source may be blocked by the light shielding portion 284, but may pass through the transparent portion 286 to reach the photoresist layer 270. Thus, the photoresist layer 270 exposed by the transparent portion 286 may be exposed to the light to form an exposed portion 272 and an unexposed portion 274. The exposed portion 272 may be removed to form a photoresist pattern.

Figure 20:
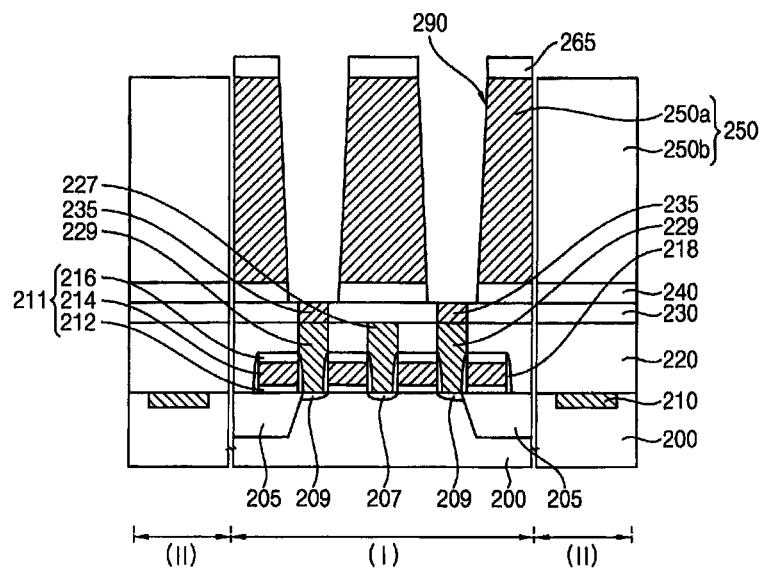

Referring to FIG. 20, the second mask layer 260, the sacrificial layer 250 and the etch stop layer 240 may be partially removed to form openings 290 exposing the third plug 235.

The second mask layer 260 may be partially removed through an etching process using the photoresist pattern as an etching mask. Accordingly, a second mask 265 partially exposing the sacrificial layer 250 may be formed.

Then, the openings 290 may be formed by partially etching the sacrificial layer 250 and the etch stop layer 240 through an etching process using the second mask 265 as an etching mask.

The openings 290 may be formed in the amorphous portion 250a of the sacrificial layer 250 including an amorphous material such as amorphous silicon. Thus, the sidewalls of the openings 290 formed by removing the amorphous material may have a good profile.

Figure 21:
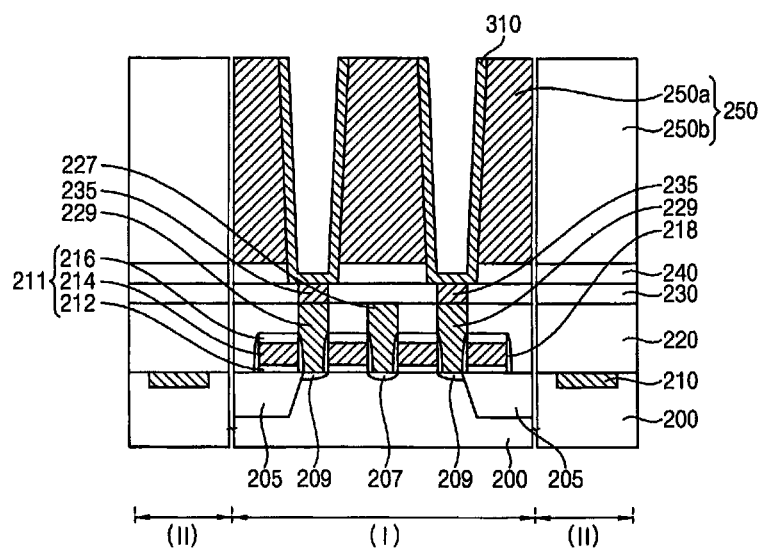

Referring to FIG. 21, a lower electrode 310 may be formed on the inner wall of the opening 290 and on the exposed third plug 235.

The lower electrode 310 may be formed by forming a lower electrode layer on the inner wall of the opening 290, the exposed third plug 235 and the sacrificial layer 250, and planarizing the upper portion of the lower electrode until exposing the upper surface of the sacrificial layer 250. In example embodiments, the lower electrode layer may be formed by using a metal such as copper, aluminum, tungsten, platinum, rubidium, iridium, etc. or a metal nitride such as titanium nitride, tantalum nitride, tungsten nitride, etc.

Figure 22:
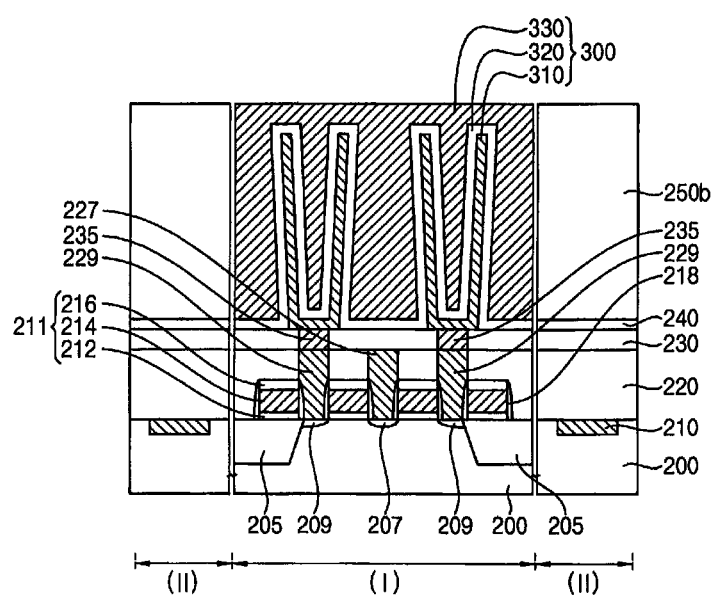

Referring to FIG. 22, the amorphous portion 250a of the sacrificial layer 250 may be removed, and then, a dielectric layer 320 and an upper electrode 330 may be formed one by one on the lower electrode 310 and the etch stop layer 240.

In an example embodiment, the amorphous portion 250a of the sacrificial layer 250 may be removed by conducting a wet etching process using a solution including ammonia, etc. In this case, the crystalline portion 250b of the sacrificial layer 250 disposed in the second region (II) may remain.

Then, the dielectric layer 320 may be formed by using a material having a high dielectricity such as tantalum oxide, hafnium oxide, aluminum oxide, zirconium oxide or a combination thereof, by means of a CVD process, a PVD process, an ALD process, etc.

The upper electrode 330 may be formed by using a metal, a metal nitride or doped polysilicon by means of a CVD process, a PVD process, an ALD process, etc. Alternatively, the upper electrode 330 may be formed as a thin film on the dielectric layer 320. The lower electrode 310, the dielectric layer 320 and the upper electrode 330 may define a capacitor 300.

In example embodiments, the sacrificial layer 250 may be positioned in the first region (I) and may include an amorphous portion 250a disposed in the first region (I) and amorphized through an ion implantation process, and a crystalline portion 250b disposed in the second region (II). Since the crystalline portion 250b may have a good transparency, the position of the first alignment mark 210 disposed in the second region (II) may be easily detected, and an alignment precision in the photolithography process may be improved. In addition, the opening 290 may be formed by partially removing the amorphous portion 250a, and the sidewall roughness of the opening 290 may be decreased.

Through conducting the above described processes, a semiconductor device including a gate structure 211 and a capacitor 300 may be manufactured.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device comprising:
   forming an alignment mark on a substrate including a first region and a second region, the alignment mark being formed in the second region;
   forming an etch target layer including a crystalline material on the alignment mark and the substrate;
   partially amorphizing the etch target layer positioned in the first region; and
   partially etching the amorphized etch target layer.

2. The method of claim 1, wherein amorphizing the etch target layer positioned in the first region includes an ion implantation process.

3. The method of claim 2, wherein the ion implantation process uses silicon (Si), boron (B), phosphor (P), arsenic (As), germanium (Ge) or indium (In) ions.

4. The method of claim 2, wherein the ion implantation process is conducted by injection energy of about 50 KeV to about 3,000 KeV, with a dose of about 1E15 ions/cm$^2$ to about 1E16 ions/cm$^2$.

5. The method of claim 2, wherein the ion implantation process is conducted two or more times by changing the injection energy and a kind of the ions.

6. The method of claim 1, after amorphizing the etch target layer positioned in the first region, further comprising:
   forming a photoresist layer on the etch target layer;
   aligning the substrate with a photo mask by using the alignment mark; and
   partially removing the photoresist layer to form a photoresist pattern through a photolithography process using the photo mask.

7. The method of claim 6, before forming the photoresist layer, further comprising forming a mask layer on the etch target layer,
   and after forming the photoresist layer, further comprising partially removing the mask layer to form a mask through an etching process using the photoresist pattern, wherein the mask is used as an etching mask while etching the amorphized etch target layer.

8. The method of claim 6, wherein the alignment mark is a first alignment mark and wherein the photo mask includes a second alignment mark, and the second alignment mark has a position and a shape corresponding to the first alignment mark.

9. The method of claim 1, wherein forming the etch target layer includes depositing a polysilicon layer or an impurity doped polysilicon layer on the substrate.

10. The method of claim 1, wherein forming the etch target layer comprises:
    forming an amorphous silicon layer or an impurity doped amorphous silicon layer on the substrate; and
    crystallizing the amorphous silicon layer or the impurity doped amorphous silicon layer.

11. The method of claim 1, wherein the alignment mark is formed on an upper portion of the substrate.

12. The method of claim 1, wherein the alignment mark is formed on the substrate.

13. A method of manufacturing a semiconductor device comprising:
    forming a material layer on a substrate having an alignment mark, the material layer comprising an amorphous portion that is laterally offset from the alignment mark and a crystalline portion that is over the alignment mark; and
    photolithographically etching the amorphous portion, using the alignment mark that is under the crystalline portion.

14. The method of claim 13, wherein the photolithographically etching the amorphous portion comprises:
    forming a photoresist layer on the material layer;
    aligning the substrate with a photo mask using the alignment mark;
    patterning the photoresist layer using the photo mask that is aligned with the substrate; and
    etching the amorphous portion using the photoresist layer that is patterned.

15. The method of claim 13, wherein the forming a material layer on the substrate comprises:
    forming a crystalline layer on the substrate; and
    selectively amorphizing the crystalline layer to form the amorphous portion of the material layer that is laterally offset from the alignment mark.

16. The method of claim 13, wherein the forming a material layer on the substrate comprises:
    forming an amorphous layer on the substrate; and
    selectively crystallizing the amorphous layer to form the crystalline portion of the material layer that is over the alignment mark.

17. The method of claim 13, wherein the material layer comprises elemental silicon.

* * * * *